(12) United States Patent
Kim et al.

(10) Patent No.: US 12,069,815 B2
(45) Date of Patent: Aug. 20, 2024

(54) ELECTRONIC DEVICE COMPRISING REINFORCEMENT STRUCTURE FOR DAMAGE PREVENTION

(71) Applicant: Samsung Electronics Co., Ltd., Suwon-si (KR)

(72) Inventors: Hyunho Kim, Suwon-si (KR); Jehyun Son, Suwon-si (KR); Taewon Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 163 days.

(21) Appl. No.: 17/824,142

(22) Filed: May 25, 2022

(65) Prior Publication Data

US 2022/0295647 A1 Sep. 15, 2022

Related U.S. Application Data

(63) Continuation of application No. PCT/KR2021/009917, filed on Jul. 29, 2021.

(30) Foreign Application Priority Data

Jul. 29, 2020 (KR) .................. 10-2020-0094724

(51) Int. Cl.
 *H05K 5/00* (2006.01)
 *H01R 12/75* (2011.01)
(52) U.S. Cl.
 CPC ........... *H05K 5/0069* (2013.01); *H01R 12/75* (2013.01); *H05K 5/0017* (2013.01)
(58) Field of Classification Search
 CPC .............. H05K 5/0017; H05K 5/0217

USPC ........................................... 361/807
 See application file for complete search history.

(56) References Cited

U.S. PATENT DOCUMENTS

| 8,221,137 B2 | 7/2012 | Zheng et al. |
| 9,490,579 B2 | 11/2016 | Little et al. |
| 10,283,915 B2 | 5/2019 | Han et al. |
| 10,424,876 B1 | 9/2019 | Bandoh et al. |

(Continued)

FOREIGN PATENT DOCUMENTS

| JP | 4346649 B2 | 10/2009 |
| JP | 2012-209883 A | 10/2012 |

(Continued)

OTHER PUBLICATIONS

Extended European Search Report dated Dec. 1, 2023, issued in European Patent Application No. EP21849012.6.

*Primary Examiner* — Hung S. Bui
(74) *Attorney, Agent, or Firm* — Jefferson IP Law, LLP

(57) ABSTRACT

An electronic device is provided. The electronic device includes a display forming the front surface of the electronic device, a housing in which the display is seated and which at least forms a first side surface of the electronic device, an opening provided in the first side surface formed by the housing, a printed circuit board disposed adjacent to the first side surface, a connecting interface disposed on the PCB so as to be electrically connected to an external connector when the external connector is inserted through the opening, and a reinforcement member disposed on the PCB so as to surround the side surface of the connecting interface without covering the top surface of the connecting interface.

21 Claims, 12 Drawing Sheets

(56) References Cited

U.S. PATENT DOCUMENTS

| | | | |
|---|---|---|---|
| 2009/0149055 A1* | 6/2009 | Uchikawa | H01R 13/6395 439/367 |
| 2013/0309890 A1* | 11/2013 | Matsui | H01R 13/46 439/296 |
| 2019/0237912 A1* | 8/2019 | Little | H01R 13/6581 |
| 2020/0007812 A1* | 1/2020 | Hino | H05K 7/14 |
| 2020/0044396 A1* | 2/2020 | Ito | H01Q 1/243 |
| 2020/0067218 A1 | 2/2020 | Kim et al. | |

FOREIGN PATENT DOCUMENTS

| | | |
|---|---|---|
| JP | 2012-221649 A | 11/2012 |
| JP | 2014-22305 A | 2/2014 |
| JP | 2020-35530 A | 3/2020 |
| KR | 10-2016-0024666 A | 3/2016 |

\* cited by examiner

ELECTRONIC DEVICE COMPRISING REINFORCEMENT STRUCTURE FOR DAMAGE PREVENTION

CROSS-REFERENCE TO RELATED APPLICATION(S)

This application is a continuation application, claiming priority under § 365(c), of an International application No. PCT/KR2021/009917, filed on Jul. 29, 2021, which is based on and claims the benefit of a Korean patent application number 10-2020-0094724, filed on Jul. 29, 2020, in the Korean Intellectual Property Office, the disclosure of which is incorporated by reference herein in its entirety.

BACKGROUND

1. Field

The disclosure relates to an electronic device including a reinforcement structure capable of reinforcing the strength of a connecting interface and reducing the thickness of the electronic device.

2. Description of Related Art

There has been increasing user demands for portable electronic device designed to be light and slim, and users tend to prefer portable electronic device designed to be light, slim, and durable.

Each portable electronic device includes, on a side surface thereof, a connecting interface (for example, universal serial bus (USB)) for charging or data transmission. By repeatedly attaching/detaching an external connector, the user connects the portable electronic device to the external connector and use the same accordingly.

The above information is presented as background information only, and to assist with an understanding of the disclosure. No determination has been made, and no assertion is made, as to whether any of the above might be applicable as prior art with regard to the disclosure.

A universal serial bus (USB) connecting interface (or USB connecting part) positioned in an opening of a portable electronic device may be damaged by repeatedly attaching/detaching an external connector thereto/therefrom. There is a need for a structure capable of reducing the thickness for durable, light, and slim design in order to prevent such damages.

According to the prior art, a durability reinforcement structure is a separate mechanical element which surrounds all or a side surface of the USB connecting interface, or which covers the same in a stacked form, and may increase the thickness of the portable electronic device.

The prior art has a problem in that a durability reinforcement structure attached by a separate tape may be damaged by an impact applied thereto.

Aspects of the disclosure are to address at least the above-mentioned problems and/or disadvantages and to provide at least the advantages described below. Accordingly, an aspect of the disclosure is to provide a structure for reinforcing the durability of a USB connecting interface structure, which can increase the strength of the connecting interface.

SUMMARY

Additional aspects will be set forth in part in the description which follows and, in part, will be apparent from the description, or may be learned by practice of the presented embodiments.

In accordance with an aspect of the disclosure, an electronic device is provided. The electronic device includes a display configured to form a front surface of the electronic device, a housing in which the display is seated and which at least forms a first side surface of the electronic device, an opening provided in the first side surface formed by the housing, a printed circuit board (PCB) disposed adjacent to the first side surface, a connecting interface disposed on the PCB so as to be electrically connected to an external connector when the external connector is inserted through the opening, and a reinforcement member disposed on the PCB so as to surround a side surface of the connecting interface without covering a top surface of the connecting interface.

Various embodiments of the disclosure are advantageous in that a reinforcement structure, which is not a stacked form, is applied to a connecting interface, and thus it is possible to strengthen durability of the connecting interface while reducing the thickness of an electronic device.

Various embodiments of the disclosure are advantageous in that the reinforcement structure is attached and applied in a surface mounted device (SMD) type, and a more stable shielding effect can thus be obtained.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
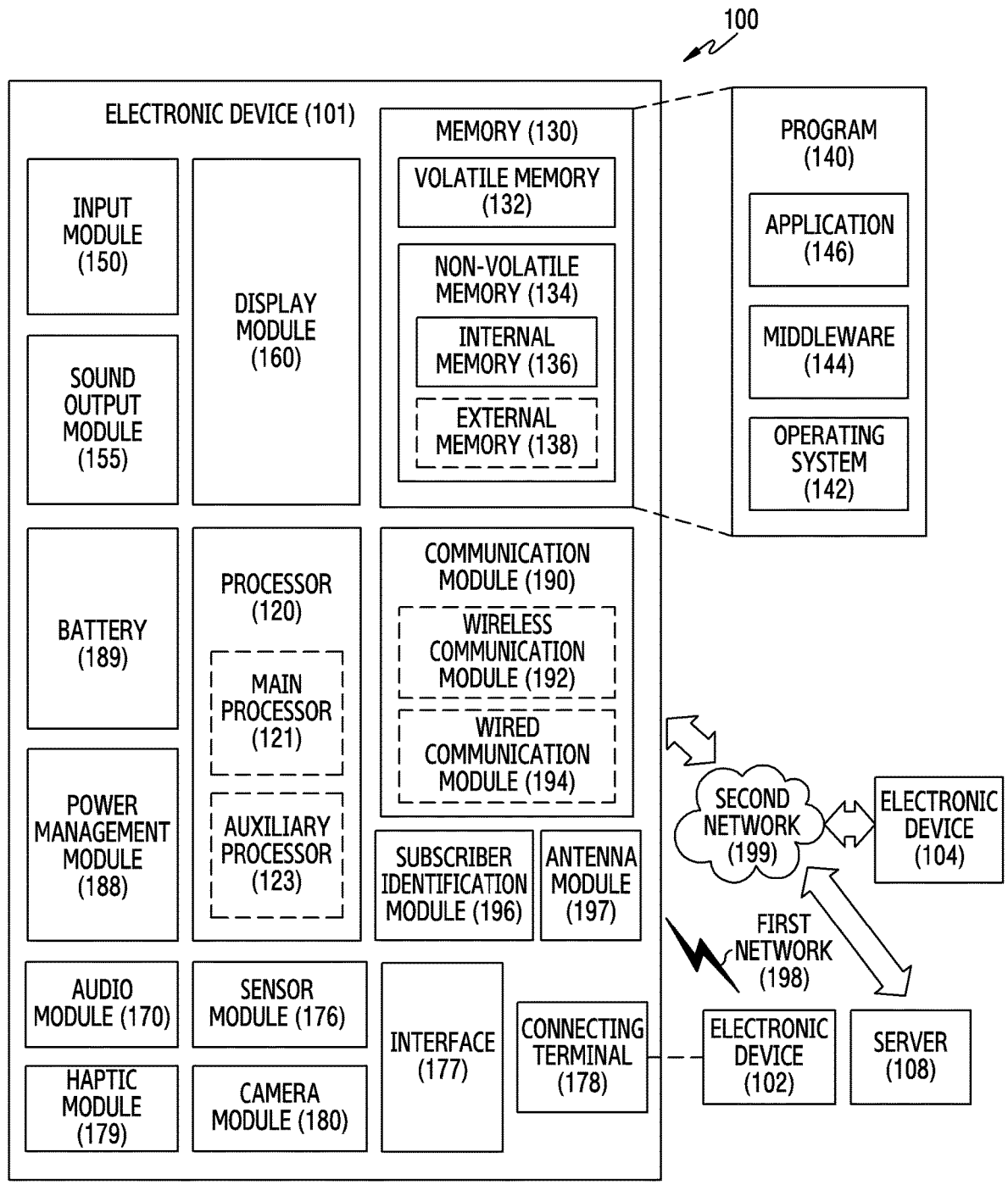
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include internal memory 136 and/or external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to or consumed by the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, Wi-Fi direct, or infrared data association (IrDA)) or the second network 199 (e.g., a long-range communication network, such as a legacy cellular network, a fifth-generation (5G) network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large-scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
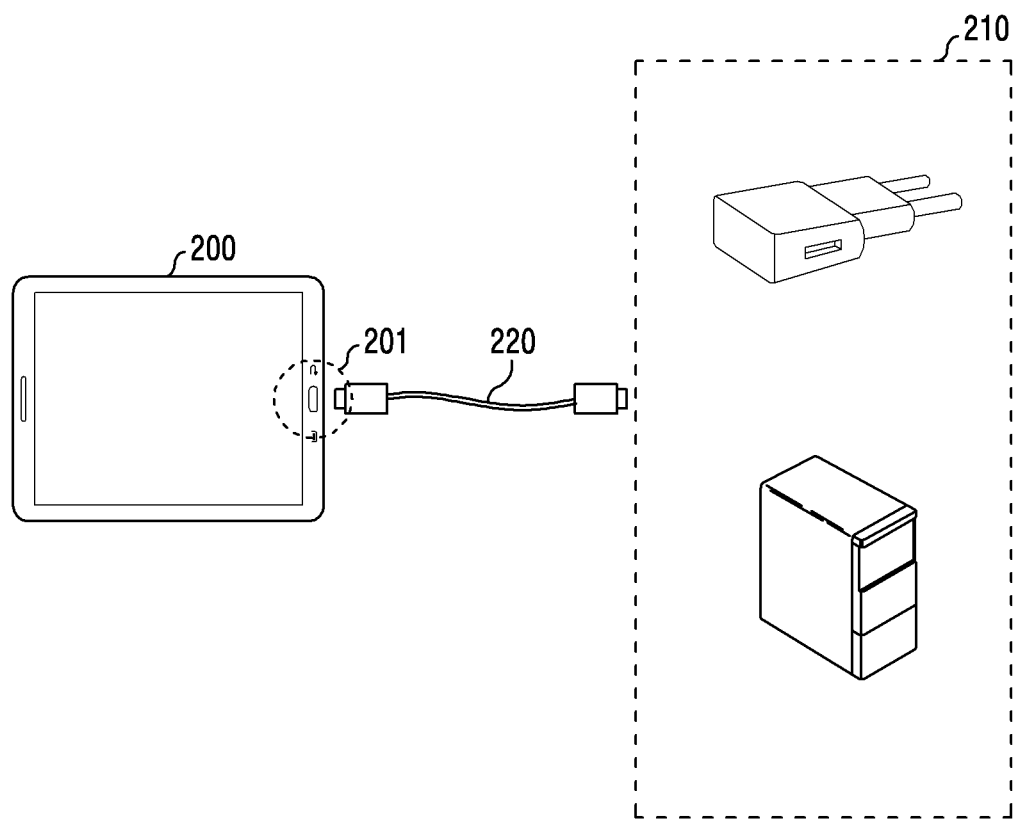
FIG. 2 illustrates an environment in which an external device according to an embodiment is connected to an opening of an electronic device through an external connector according to an embodiment of the disclosure.

FIG. 2 illustrates an environment in which an external is connected to an opening of an electronic device through an external connector according to an embodiment of the disclosure.

Referring to FIG. 2, an electronic device 200 may be connected to an external device 210 through an external connector 220. For example, the electronic device 200 may include a connection part 201 in which an opening is positioned, and a connecting interface (not shown) existing in the connection part 201 may be electrically and operatively connected to the external connector 220. Further, the external device 210 may also be electrically and operatively connected to the external connector 220 and thus may be connected to the electronic device 200.

In an embodiment, the connecting interface (not shown) may be a USB connecting interface, and the USB may be a C-type.

In an embodiment, the type of the external device 210 may be a charging device, a PC, or a portable electronic device, and the type of the external device 210 may not be limited thereto.

In an embodiment, the connecting interface (not shown) existing in the connection part 201 of the electronic device 200 may be repeatedly connected (or attached) to and disconnected (detached) from the external connector 220. For example, when the external connector 220 is connected to the connection part 201, the connecting interface (not shown) of the electronic device 200 may be connected to the external connector 220. Further, when the external connector 220 is disconnected from the connection part 201, the connecting interface (not shown) of the electronic device 200 may be disconnected from the external connector 220.

In an embodiment, due to a reinforcement structure of the connecting interface (not shown) existing in the connection part 201 of the electronic device 200, the connecting interface (not shown) may maintain high durability in spite of the repeated attachment and detachment.

A connecting interface (not shown) and a reinforcement structure according to various embodiments may be described later with reference to FIGS. 3, 4A, 4B, 5A, 5B, 6A, 6B, 6C, 7, and 8.

Figure 3:
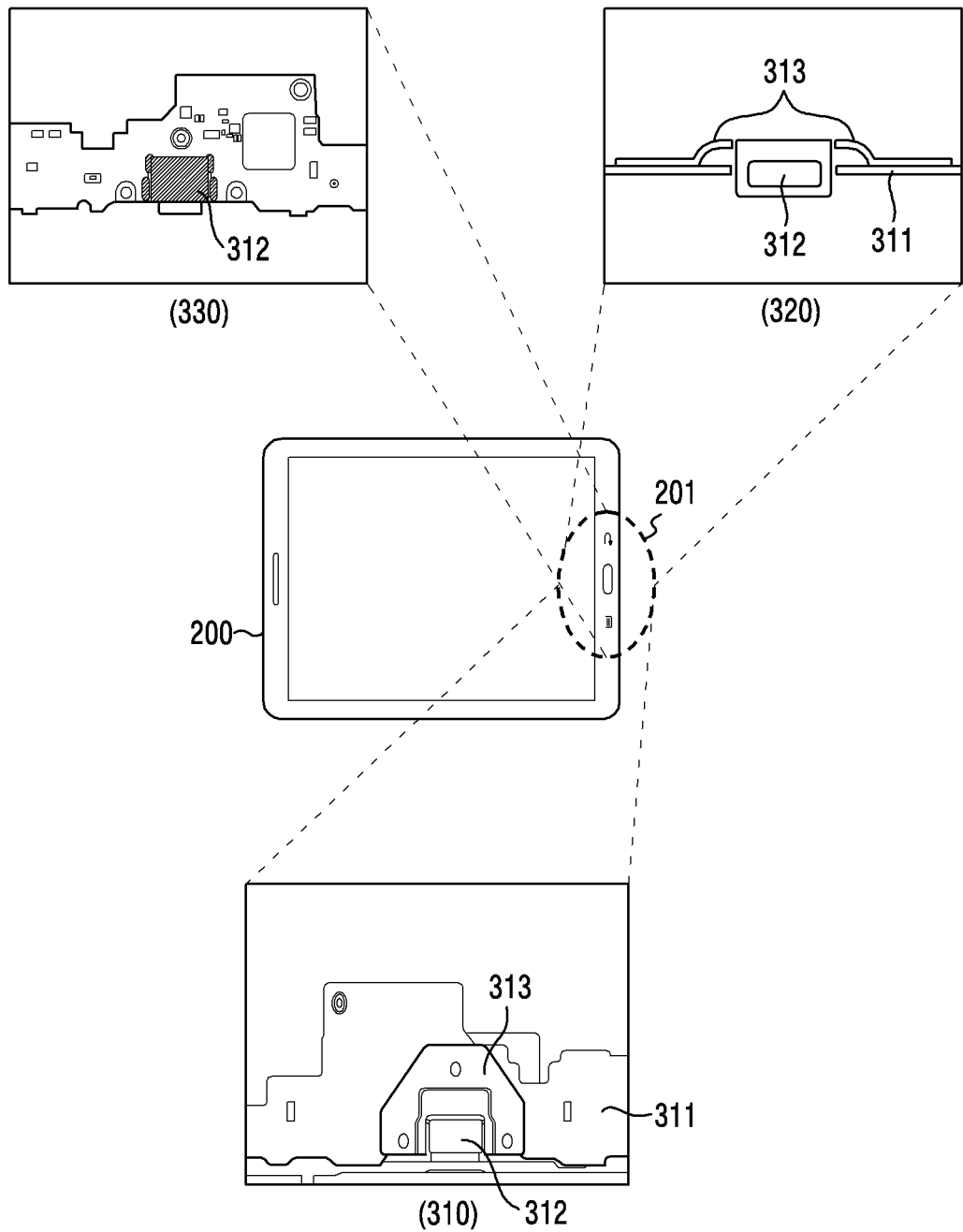
FIG. 3 is a diagram showing a reinforcement structure of an electronic device according to an embodiment of the disclosure.

FIG. 3 illustrates a reinforcement structure of an electronic device according to an embodiment of the disclosure. Further, FIG. 3 may schematically illustrate shapes of a reinforcement structure existing in the connection part 201 of the electronic device 200 when the reinforcement structure is seen from the top (e.g., image 310), the side (e.g., image 320), and the bottom (e.g., image 330).

Referring to FIG. 3, the connection part 201 of the electronic device 200 may include a reinforcement structure for durability.

According to an embodiment, image 310 in FIG. 3 may show the reinforcement structure as seen from above. For example, image 310 may at least include a PCB 311, a connecting interface 312, and a reinforcement member 313. The connecting interface 312 may be disposed in the PCB 311, and the reinforcement member 313 may be disposed around the connecting interface 312 on the PCB 311, thereby forming the reinforcement structure. Further, the reinforcement member 313 may be disposed to surround the side surface of the connecting interface 312 while being spaced apart therefrom.

According to an embodiment, image 320 in FIG. 3 may show the reinforcement structure as seen from the side. For example, the reinforcement member 313 may be disposed on the PCB 311 while surrounding the side surface of the connecting interface 312. Further, the connecting interface 312 may be disposed in a mounting space of the PCB 311 through a connection member (not shown). According to an embodiment, the position of the top surface of the reinforcement member 313 may be substantially equal to the position of the top surface of the connecting interface 312, or the position of the top surface of the reinforcement member 313 may be lower than the position of the top surface of the connecting interface 312.

According to an embodiment, image 330 in FIG. 3 may show the reinforcement structure as seen from the bottom. For example, the connecting interface 312 may be disposed in the PCB 311, and when the bottom surface of the PCB 311 is seen, the bottom surface of the connecting interface 312 may also be seen.

A detailed description of a reinforcement structure according to various embodiments will be made later, where necessary, with reference to FIGS. 4A, 4B, 5A, 5B, 6A, 6B, 6C, 7, and 8.

Figure 4A:
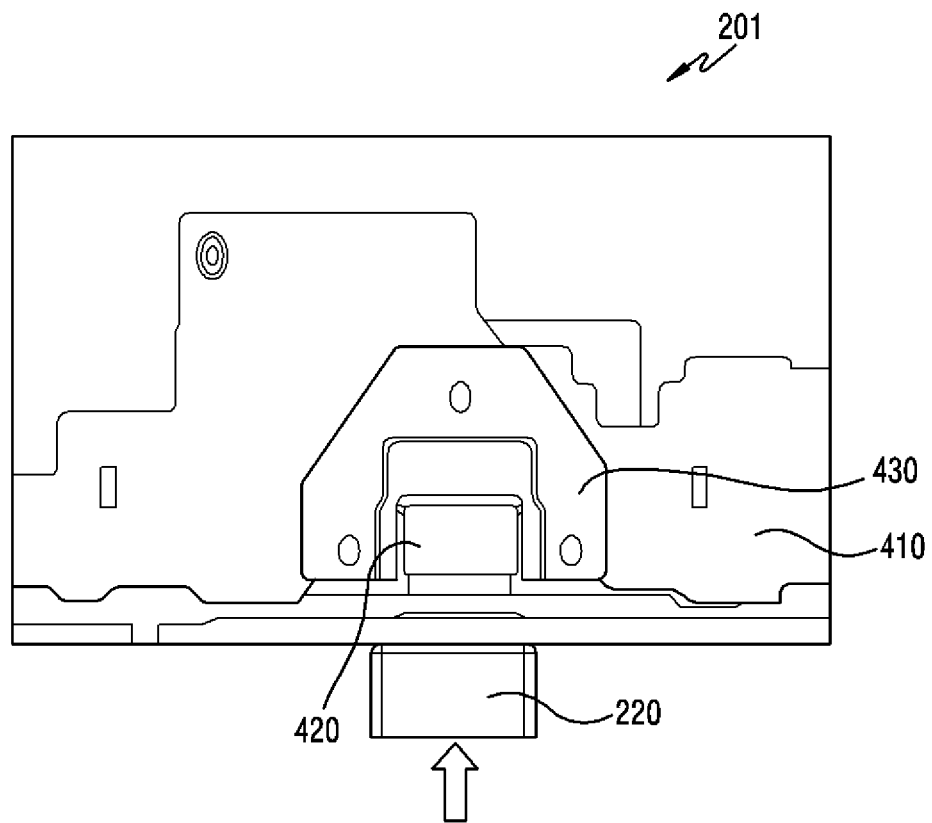
FIG. 4A is a top view showing a reinforcement structure of an electronic device when seen from above according to an embodiment of the disclosure.

FIG. 4A shows a reinforcement structure of an electronic device when the reinforcement structure is seen from above according to an embodiment of the disclosure.

Figure 4B:
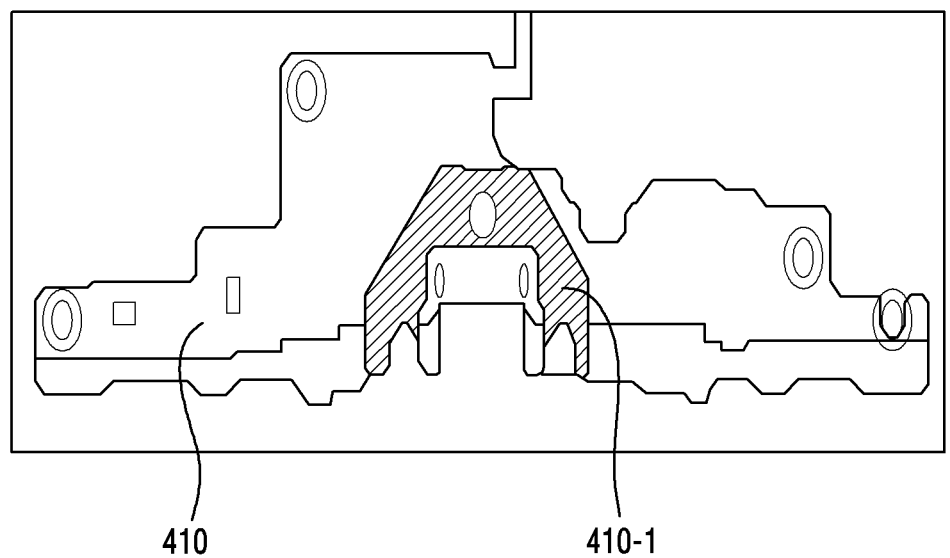
FIG. 4B is a top view showing a surface mount region of a reinforcement structure of an electronic device when the reinforcement structure is seen from above according to an embodiment of the disclosure.

FIG. 4B shows a surface mount region of a reinforcement structure of an electronic device when the reinforcement structure is seen from above according to an embodiment of the disclosure.

Referring to FIGS. 2 and 4A, the connection part 201 in which an opening of the electronic device 200 is positioned may include a reinforcement structure including a reinforcement member 430. For example, the external connector 220 may be attached to or detached from a connecting interface 420 of the connection part 201, and the reinforcement member 430 may be disposed on a PCB 410, thereby supporting the connecting interface 420. The reinforcement member 430 may be disposed on the PCB 410 while surrounding at least a part of the connecting interface 420, and may minimize movement of the PCB 410 caused by an external force that may be generated by an operation of fastening the external connector 220.

In an embodiment, the connecting interface 420 may be disposed in a mounting space of the PCB 410. For example, the connecting interface 420 may be disposed in the mounting space of the PCB 410, and may be fixed in the mounting space of the PCB 410 through a connection member (not shown) which connects the PCB 410 to the connecting interface 420. Further, the connecting interface 420 may be fixed in the mounting space of the PCB 410 by being soldered to at least a part of the PCB 410.

In another embodiment, the connecting interface 420 may be disposed in the mounting space of the PCB 410 while being in direct contact with the PCB 410. For example, the connecting interface 420 may be disposed in a surface mount region (410-1 of FIG. 4B) on the PCB 410 based on surface mount technology (SMT).

Referring to FIGS. 4A and 4B, the reinforcement member 430 for reinforcing the connecting interface 420 may be disposed in the surface mount region 410-1 on the PCB 410 based on SMT. The reinforcement member 430 may be directly attached onto the surface mount region 410-1 of the PCB 410 by using an adhesive, and soldering may be performed. The rigidity of the PCB 410 and the reinforcement member 430 may be ensured by soldering the bottom surface of the reinforcement member 430 to the surface of the surface mount region 410-1 of the PCB 410.

In an embodiment, the surface mount region 410-1 may be identical to the region illustrated in FIG. 4B according to the shape and size of the reinforcement member 430, but may not be limited to the region illustrated in FIG. 4B.

In an embodiment, the reinforcement member 430 may be formed of stainless steel (e.g., steel use stainless (SUS)). For example, the reinforcement member 430 may be formed of one among austenite type stainless steel, ferrite type stainless steel, martensite type stainless steel, precipitation hardening type stainless steel, and duplex type stainless steel.

In an embodiment, the reinforcement member 430 may be disposed so as not to cover the top surface of the connecting interface 420. For example, the reinforcement member 430 may be disposed around the connecting interface 420 on the PCB 410 so as not to cover the top surface of the connecting interface 420, and thus the connecting interface 420 may be seen when seen from above. Further, the reinforcement member 430 is disposed so as not to cover the top surface of the connecting interface 420, and thus the reinforcement member 430 and the connecting interface 420 do not form a stacked structure. Therefore, the electronic device 200 may be thinner than that in the case of the stacked structure.

In an embodiment, the reinforcement member 430 may be disposed to surround the side surface of the connecting interface 420. For example, the reinforcement member 430 may be disposed around the connecting interface 420 on the PCB 410, and may be disposed along the side surface of the connecting interface 420 while surrounding the side surface of the connecting interface 420. Further, the reinforcement member 430 may be disposed on the PCB 410 so as not to block an opening through which the connecting interface 420 is connected to the external connector 220. Further, the reinforcement member 430 may be disposed so as to surround the side surface of the connecting interface 420 while being spaced apart from the side surface of the connecting interface 420. The reinforcement member 430 is disposed to surround the side surface of the connecting interface 420, and thus the reinforcement member 430 may support the side surface of the connecting interface 420, thereby ensuring rigidity.

In an embodiment, the reinforcement member 430 may be formed integrally with the connecting interface 420. For example, when the reinforcement member 430 and the connecting interface 420 are integrated with each other, the reinforcement member 430 and the connecting interface 420 may be integrated with each other by being soldered to each other or attached to each other by an adhesive. According to an embodiment, the reinforcement member 430 and the connecting interface 420, which are integrated with each other, may be attached to the PCB 410 based on SMT. As described above, the reinforcement member 430 is integrated with the connecting interface 420 and attached to the PCB 410, and thus may support the side surface of the connecting interface 420, thereby ensuring rigidity. According to an embodiment, the reinforcement member 430 and the connecting interface 420 may be integrally fixed to the PCB 410 through screw fastening.

Figure 5A:
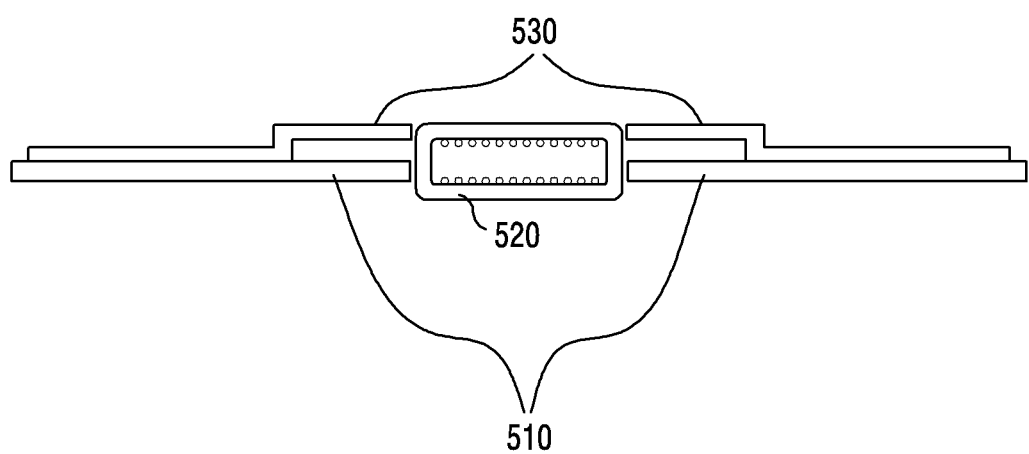
FIG. 5A is a side view of a reinforcement structure of an electronic device when seen from a side according to an embodiment of the disclosure.

FIG. 5A is a side view of a reinforcement structure of an electronic device when seen from a side according to an embodiment of the disclosure.

Figure 5B:
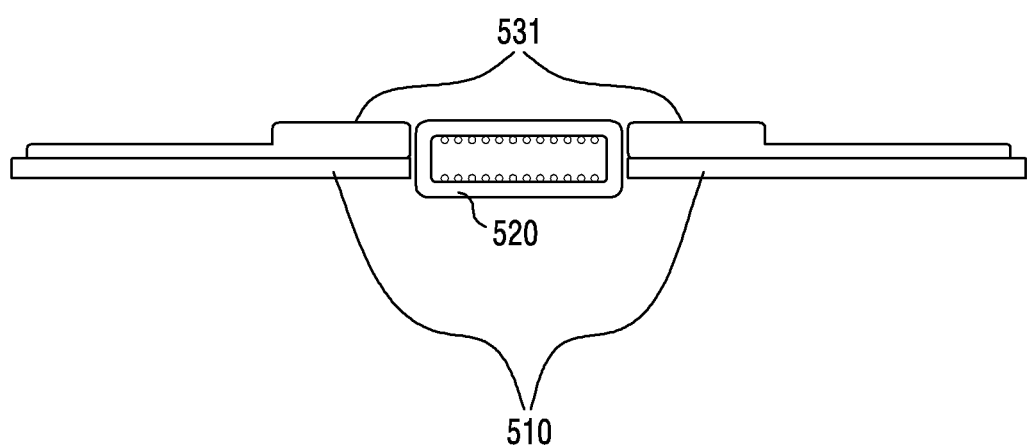
FIG. 5B is a side view of a reinforcement structure of an electronic device when seen from a side according to an embodiment of the disclosure.

FIG. 5B is a side view of a reinforcement structure of an electronic device when seen from a side according to an embodiment of the disclosure.

A reinforcement structure of an electronic device according to various embodiments when seen from the side will be described below with reference to FIGS. 5A and 5B.

Referring to FIG. 5A, FIG. 5A briefly shows an arrangement of a PCB 510, a connecting interface 520, and a reinforcement member 530.

In an embodiment, the connecting interface 520 may be disposed in a mounting space of the PCB 510, and the reinforcement member 530 may be attached to the PCB 510 based on SMT. The reinforcement member 530 may be disposed so as not to cover the top surface of the connecting interface 520 while surrounding the connecting interface 520.

In an embodiment, an empty space (or air gap) may be formed between the PCB 510 and the reinforcement member 530 and around the connecting interface 520. For example, the reinforcement member 530 may be soldered and attached to the PCB 510, and there may be an empty space between the PCB 510 and the reinforcement member 530 at a portion at which the reinforcement member 530 supports the connecting interface 520 or a portion around the connection interface 520 from the connecting interface 520 to a specific distance therefrom.

In an embodiment, the connecting interface 520 and the reinforcement member 530 may have substantially the same height. For example, the top surface of the connecting interface 520 and the top surface of the reinforcement member 530 may have the same height (or length) in the upward direction from the PCB 510, and thus there may be no differences therein.

In another embodiment, the connecting interface 520 and the reinforcement member 530 may have different heights. For example, in the top surface of the connecting interface 520 and the top surface of the reinforcement member 530, the connecting interface 520 may have a larger height (or length) in the upward direction from the PCB 510.

In an embodiment, when seen from the side, a portion, at which the height of the reinforcement member 530 is changed, may be connected at a right angle as illustrated in FIG. 5A, or may be connected in the form of a smooth curve, unlike illustration of FIG. 5A.

In an embodiment, the reinforcement member 530 may be configured so as not to be physically and directly connected to the connecting interface 520. For example, the reinforcement member 530 may be configured so as not to be physically connected to the connecting interface 520, and thus may be configured to indirectly reinforce the strength of the connecting interface 520.

In another embodiment, the reinforcement member 530 may also be configured to be physically connected to the connecting interface 520. For example, the reinforcement member 530 may be configured to be physically connected to the connecting interface 520 so that the reinforcement member 530 directly reinforces the strength of the connecting interface 520.

In another embodiment, the reinforcement member 530 may be connected to the connecting interface 520 through a connection member (not shown), thereby reinforcing the strength of the connecting interface 520.

Referring to FIG. 5B, FIG. 5B briefly shows an arrangement of the PCB 510, the connecting interface 520, and a reinforcement member 531. The reinforcement member 531 in FIG. 5B may be different in shape from the reinforcement member 530 in FIG. 5A, and will be described later where necessary.

In an embodiment, the connecting interface 520 may be disposed in a mounting space of the PCB 510, and the reinforcement member 531 may be attached onto the PCB 510 based on SMT. The reinforcement member 531 may be disposed so as not to cover the top surface of the connecting interface 520 while surrounding the connecting interface 520.

In an embodiment, unlike FIG. 5A, there may be no empty space between the PCB 510 and the reinforcement member 531 and around the connecting interface 520. For example, the reinforcement member 531 may be soldered and attached to the PCB 510, and there may be no empty space between the PCB 510 and the reinforcement member 531 at a portion at which the reinforcement member 531 supports the connecting interface 520 or a portion around the connecting interface 520 from the connecting interface 520 to a specific distance therefrom.

In an embodiment, the connecting interface 520 and the reinforcement member 531 may have the same height. For example, the top surface of the connecting interface 520 and the top surface of the reinforcement member 531 may have the same height (or length) in the upward direction from the PCB 510, and thus there may be no differences therein.

In another embodiment, the connecting interface 520 and the reinforcement member 531 may have different heights. For example, in the top surface of the connecting interface 520 and the top surface of the reinforcement member 531, the connecting interface 520 may have a larger height (or length) in the upward direction from the PCB 510.

In an embodiment, when seen from the side, a portion, at which the height of the reinforcement member 531 is changed, may be connected at a right angle, or may be connected in the form of a smooth curve. Further, when seen from the side, the shape of a portion at which the height of the reinforcement member 531 is changed may not be limited according to a design.

In an embodiment, the reinforcement member 531 may be configured so as not to be physically connected to (or so as to be spaced apart from) the connecting interface 520. For example, the reinforcement member 531 may be configured so as not to be physically connected to the connecting interface 520, and thus may be configured to indirectly reinforce the strength of the connecting interface 520.

In another embodiment, the reinforcement member 531 may be configured to be physically connected to the connecting interface 520. For example, the reinforcement member 531 may be configured to be physically connected to (e.g., be in contact with) the connecting interface 520 so that the reinforcement member 531 directly reinforces the strength of the connecting interface 520. The reinforcement member 531 may be connected to the connecting interface 520 through a connection member (not shown), thereby reinforcing the strength of the connecting interface 520.

In an embodiment, a reinforcement member (e.g., the reinforcement member 530 or the reinforcement member 531) may have a uniform thickness. Further, the reinforcement member (e.g., the reinforcement member 530 or the reinforcement member 531) may not have a uniform thickness.

In an embodiment, the reinforce member (e.g., the reinforcement member 530 or the reinforcement member 531) and the connecting interface 520, described with reference to FIGS. 5A and 5B, may be integrated with each other. For example, when the reinforcement member (e.g., the reinforcement member 530 or the reinforcement member 531) and the connecting interface 520 are integrated with each other, the reinforcement member (e.g., the reinforcement member 530 or the reinforcement member 531) and the connecting interface 520 may be integrated with each other by being soldered to each other or attached to each other by an adhesive. According to an embodiment, the reinforcement member (e.g., the reinforcement member 530 or the reinforcement member 531) and the connecting interface 520, which are integrated with each other, may be attached to the PCB 510 based on SMT. As described above, the reinforcement member (e.g., the reinforcement member 530 or the reinforcement member 531) is integrated with the connecting interface 520 and attached to the PCB 510, and thus may support the side surface of the connecting interface 520, thereby ensuring rigidity. According to an embodiment, the reinforcement member (e.g., the reinforcement member 530 or the reinforcement member 531) and the connecting interface 520 may be integrally fixed to the PCB 510 through screw fastening.

Figure 6A:
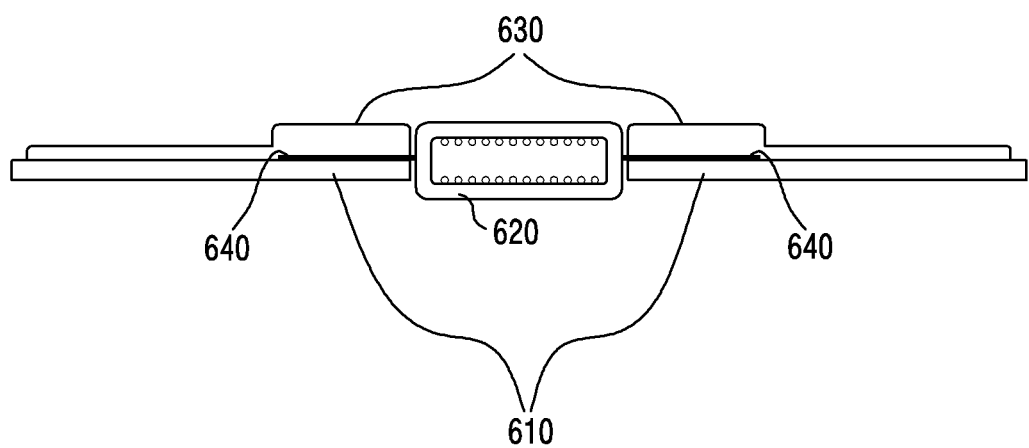
FIG. 6A is a side view of a first placement of a connection member when a reinforcement structure of an electronic device is seen from a side according to an embodiment of the disclosure.

FIG. 6A shows a first placement of a connection member when a reinforcement structure of an electronic device is seen from a side according to an embodiment of the disclosure.

Figure 6B:
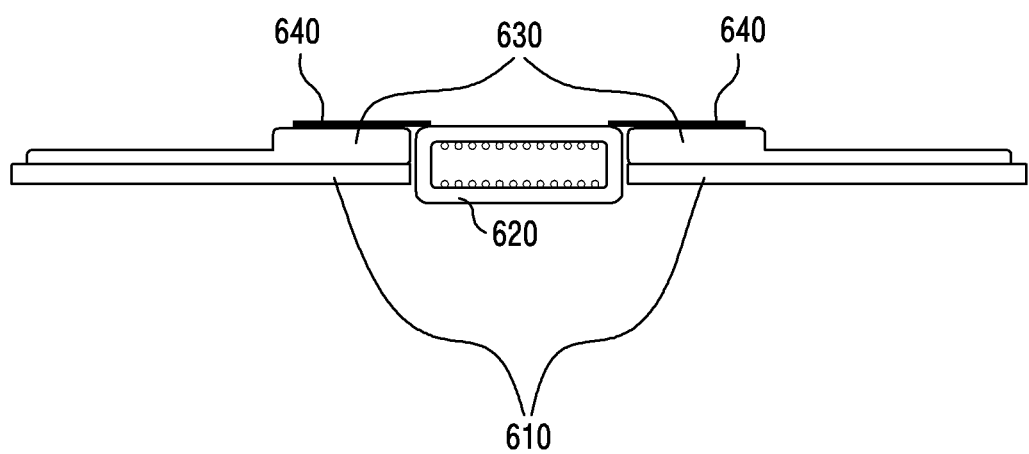
FIG. 6B is a side view of a second placement of a connection member when a reinforcement structure of an electronic device is seen from a side according to an embodiment of the disclosure.

FIG. 6B shows a second placement of a connection member when a reinforcement structure of an electronic device is seen from a side according to an embodiment of the disclosure.

Figure 6C:
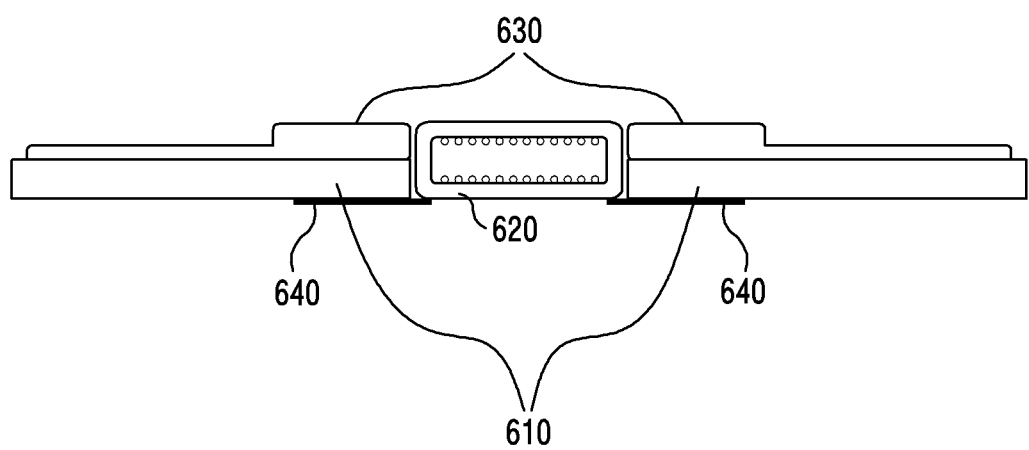
FIG. 6C is a side view of a third placement of a connection member when a reinforcement structure of an electronic device is seen from a side according to an embodiment of the disclosure.

FIG. 6C shows a third placement of a connection member when a reinforcement structure of an electronic device is seen from a side according to an embodiment of the disclosure.

The description of the PCB 510, the connecting interface 520, and the reinforcement member (e.g., the reinforcement member 530 or the reinforcement member 531), made with reference to FIGS. 5A and 5B, may also be applied to a PCB 610, a connecting interface 620, and a reinforcement member 630 according to various embodiments described with reference to FIGS. 6A to 6C.

The placement (e.g., first placement or second placement) of a connection member (e.g., a connection member 640) according to various embodiments, described with reference to FIGS. 6A to 6C, will be described based on the PCB 610, the connecting interface 620, and the reinforcement member 630 corresponding to the PCB 510, the connecting interface 520, and the reinforcement member 531 in FIG. 5B.

In an embodiment, the reinforcement member 630 may be connected to the connecting interface 620 by using the connection member 640. The connection member 640 may be configured to be coupled to the reinforcement member 630 and the connecting interface 620, and thus the reinforcement member 630 may be configured to reinforce the strength of the connecting interface 620.

Referring to FIG. 6A, the connection member 640 may be disposed between the PCB 610 and the reinforcement member 630 (e.g., first placement). For example, the connection member 640 may be disposed on and fixed to the PCB 610 together with a housing 630 based on SMT. Further, the connection member 640 may be coupled and fixed to the connecting interface 620. As described above, the connection member 640 may be placed between the PCB 610 and the reinforcement member 630, and thus the reinforcement member 630 may reinforce the strength of the connecting interface 620.

In an embodiment, the reinforcement member 630 may be placed around the connecting interface 620 on the PCB 610, thereby compensating for the rigidity of the PCB 610, and may thus compensate for the strength of the connecting interface 620 against the movement thereof by an external force.

Referring to FIG. 6B, the connection member 640 may be disposed on the top surface of the reinforcement member 630 (e.g., second placement). For example, the connection member 640 may be disposed on and fixed to the top surface of the reinforcement member 630 which is mounted on the PCB 610 based on SMT. Further, the connection member 640 may be coupled and fixed to the connecting interface 620. As described above, the connection member 640 is fixed to the top surface of the reinforcement member 630, and thus the reinforcement member 630 may reinforce the strength of the connecting interface 620.

Referring to FIG. 6C, the connection member 640 may be disposed on the bottom surface of the PCB 610 (e.g., third placement). For example, the connection member 640 may be disposed on and fixed to the bottom surface of the PCB 610, and may be brought into direct contact with (or coupled) and fixed to the connecting interface 620. As described above, the connection member 640 is fixed to the bottom surface of the PCB 610, and thus the reinforcement member 630 may indirectly reinforce the strength of the connecting interface 620. In an embodiment, the connection member 640 may be integrated with the connecting interface 620, and the connection member 640 may be a member allowing the connecting interface 620 to be connected or fixed to the PCB 610. For example, the connection member 640 may be disposed in a hole or a surface mount region 410-1, formed in the PCB 610, based on SMT (e.g., soldering).

In another embodiment, although not illustrated in FIGS. 6A to 6C, a support member (not shown) for ensuring the rigidity of each of the PCB 610, the reinforcement member 630, and the connection member 640 may also be included. For example, the support member (now shown) may penetrate the PCB 610, the reinforcement member 630, and the connection member 640, and the support member (not shown) may be fixedly disposed while penetrating the PCB 610, the reinforcement member 630, and the connection member 640, thereby ensuring the rigidity. Further, in another example, the support member may be fastened and fixed to a housing (not shown) of the electronic device.

The placement (e.g., the first placement and the second placement) of the connection member (e.g., the connection member 640) according to various embodiments, described with reference to FIGS. 6A to 6C, may be applied to the structure of the PCB 510, the connecting interface 520, and the reinforcement member (e.g., the reinforcement member 530 and the reinforcement member 531) in FIG. 5A.

Figure 7:
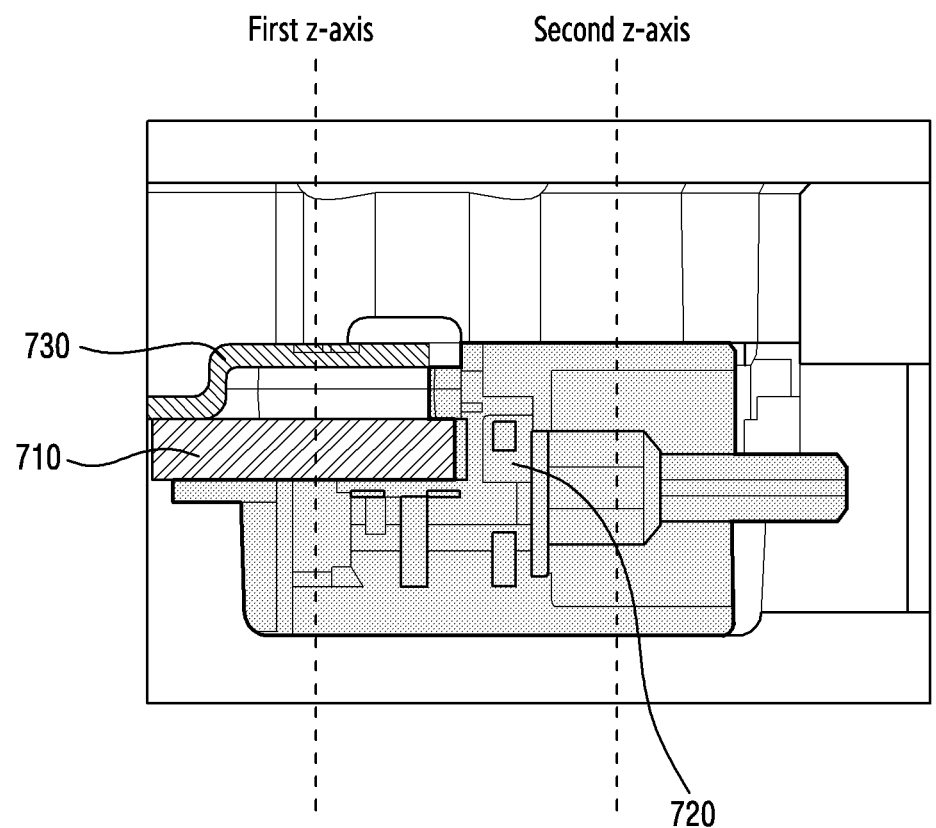
FIG. 7 illustrates an example of a reinforcement structure of an electronic device according to an embodiment of the disclosure.

FIG. 7 illustrates an example of a reinforcement structure of an electronic device according to an embodiment of the disclosure.

Referring to FIG. 7, a reinforcement structure of the electronic device 200 may include a PCB 710, a connecting interface 720, and a reinforcement member 730.

According to an embodiment, the connecting interface 720 may be disposed in the PCB 710, and the reinforcement member 730 may be disposed around the connecting interface 720 on the PCB 710, thereby forming a reinforcement structure.

According to an embodiment, the reinforcement member 730 may be disposed on the PCB 710 while surrounding the side surface of the connecting interface 720. Further, the connecting interface 720 may be disposed in a mounting space of the PCB 710 through a connection member (not shown).

According to an embodiment, the reinforcement member 730 may be placed on the top surface of the PCB 710. When seen from above, at least a partial region of the reinforcement member 730 may overlap the connecting interface 720. For example, when described with reference to an imaginary z-axis (e.g., a first z-axis and a second z-axis) in FIG. 7, the reinforcement member 730 may be disposed such that at least a partial region thereof overlaps at least a partial region of the connecting interface 720 with reference to the first z-axis. Further, the reinforcement member 730 may be disposed such that at least a partial region thereof does not overlap the connecting interface 720 with reference to the second z-axis.

Figure 8:
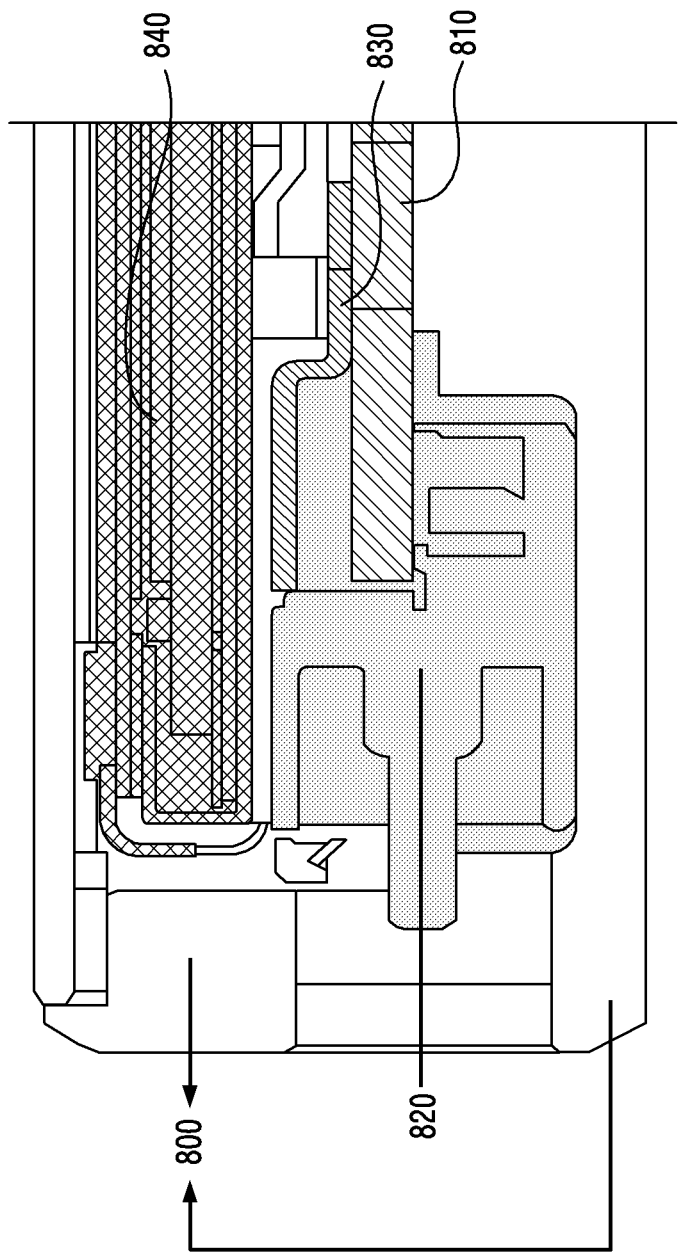
FIG. 8 illustrates a specific example of a reinforcement structure of an electronic device according to an embodiment of the disclosure.

FIG. 8 illustrates a specific example of a reinforcement structure of an electronic device according to an embodiment of the disclosure. Further, FIG. 8 illustrates an example of a specific structure when the reinforcement structure in FIG. 7 according to an embodiment is seen from the opposite side.

Referring to FIG. 8, the electronic device 200 may include a housing 800, a PCB 810, a connecting interface 820, a reinforcement member 830, and a display module 840.

In an embodiment, the housing 800 may form the side surface of the electronic device 200. For example, the connection part 201, to which the external connector 220 can be connected, may be present at one side surface of the electronic device 200. The connection part 201 may include an opening for connecting the external connector 220 thereto, and the opening may be formed through the housing 800. In another example, the opening, through which the external connector 220 can be connected to the connection part 201, may be formed through the housing 800 of one side surface of the electronic device 200.

In an embodiment, the housing 800 may have a structure in which the housing surrounds the PCB 810, the connecting interface 820, and the reinforcement member 830, and the display module 840 may be seated in the housing 800.

In an embodiment, the PCB 810 may be disposed adjacent to one side surface of the electronic device 200. For example, the PCB 810 may be disposed adjacent to one side surface of the electronic device 200, in which the opening is positioned.

In an embodiment, the connecting interface 820 may be disposed in a mounting space positioned at a side of an opening of the PCB 810. For example, the connecting interface 820 may be disposed in the mounting space of the PCB 810 while being brought into direct contact with and fixed to the PCB, and may also be fixed and disposed through a connection member (not shown).

In an embodiment, the reinforcement member 830 may be disposed around the connecting interface 820 on the PCB 810, thereby forming a reinforcement structure. For example, the reinforcement member 830 may be disposed on the surface of the PCB 810 based on SMT. Further, the reinforcement member 830 may be disposed around the connecting interface 820.

According to an embodiment, the reinforcement member 830 may be disposed on the PCB 810 while surrounding the side surface of the connecting interface 820. Further, the reinforcement member 830 may be configured so as not to cover the top surface of the connecting interface 820.

In an embodiment, the display module 840 may be disposed above the reinforcement member 830. For example, the display module 840 may be seated in the housing 800, and may be seated above the reinforcement member 830. An air gap may be formed between the reinforcement member 830 and the display module 840. An empty space (or air gap) is formed between the reinforcement member 830 and the display module 840, and thus another element is not disposed therebetween. Therefore, the thickness of the electronic device 200 may be reduced.

In an embodiment, the display module 840 may be a liquid crystal display (LCD). Further, the display module 840 is not limited thereto, and may also be a light emitting diode (LED) or an organic LED (OLED).

In an embodiment, the height of the reinforcement member 830 from the PCB 810 may be configured to be equal to the height of the connecting interface 820 from the PCB 810 or smaller than the height of the connecting interface 820 from the PCB 810. Thanks to the above-described configuration, the connecting interface 820 and the reinforcement member 830 may not have a stacked structure, and the thickness of the electronic device 200 may be reduced.

An electronic device (e.g., the electronic device 200) according to an embodiment of the disclosure may include an electronic device (e.g., the electronic device 200) including a display (e.g., the display module 840) forming the front surface of the electronic device (e.g., the electronic device 200), a housing (e.g., the housing 800) in which the display (e.g., the display module 840) is seated and which at least forms the side surface of the electronic device (e.g., the electronic device 200), an opening provided in a first side surface formed by the housing (e.g., the housing 800), a PCB (e.g., the PCB 810) disposed adjacent to the first side surface, a connecting interface (e.g., the connecting interface 820) disposed on the PCB (e.g., the PCB 810) so as to be electrically connected to an external connector (e.g., the external connector 220) when the external connector (e.g., the external connector 220) is inserted through the opening, and a reinforcement member (e.g., the reinforcement member 830) disposed on the PCB (e.g., the PCB 810) so as to surround the side surface of the connecting interface (e.g., the connecting interface 820) without covering the top surface of the connecting interface (e.g., the connecting interface 820).

The electronic device (e.g., the electronic device 200) according to an embodiment of the disclosure may include an electronic device (e.g., the electronic device 200) wherein the height of the connecting interface (e.g., the connecting interface 820) may be substantially equal to the height of the reinforcement member (e.g., the reinforcement member 830).

The electronic device (e.g., the electronic device 200) according to an embodiment of the disclosure may include an electronic device (e.g., the electronic device 200) wherein the height of the reinforcement member (e.g., the reinforcement member 830) may be smaller than the height of the connecting interface (e.g., the connecting interface 820).

The electronic device (e.g., the electronic device 200) according to an embodiment of the disclosure may include an electronic device (e.g., the electronic device 200) wherein the display (e.g., the display module 840) is an LCD display (e.g., the display module 840).

The electronic device (e.g., the electronic device 200) according to an embodiment of the disclosure may include an electronic device (e.g., the electronic device 200) wherein the reinforcement member (e.g., the reinforcement member 830) disposed on the PCB (e.g., the PCB 810) is disposed based on SMT.

The electronic device (e.g., the electronic device 200) according to an embodiment of the disclosure may include an electronic device (e.g., the electronic device 200) wherein the reinforcement member (e.g., the reinforcement member 830) is formed of stainless steel.

The electronic device (e.g., the electronic device 200) according to an embodiment of the disclosure may include an electronic device (e.g., the electronic device 200) wherein an air gap is formed between the display (e.g., the display module 840) and the reinforcement member (e.g., the reinforcement member 830).

The electronic device (e.g., the electronic device 200) according to an embodiment of the disclosure may include an electronic device (e.g., the electronic device 200) wherein there is an empty space between the reinforcement member (e.g., the reinforcement member 830) and the PCB (e.g., the PCB 810).

The electronic device (e.g., the electronic device 200) according to an embodiment of the disclosure may include an electronic device (e.g., the electronic device 200) wherein the connecting interface (e.g., the connecting interface 820) is connected to the reinforcement member (e.g., the reinforcement member 830) through a connection member.

The electronic device (e.g., the electronic device 200) according to an embodiment of the disclosure may include an electronic device (e.g., the electronic device 200) wherein the connection member is disposed between the reinforcement member (e.g., the reinforcement member 830) and the PCB (e.g., the PCB 810).

The electronic device (e.g., the electronic device 200) according to an embodiment of the disclosure may include an electronic device (e.g., the electronic device 200) wherein the connection member is disposed on the reinforcement member (e.g., the reinforcement member 830).

The electronic device (e.g., the electronic device 200) according to an embodiment of the disclosure may include an electronic device (e.g., the electronic device 200) wherein the connecting interface (e.g., the connecting interface 820) is connected to the PCB (e.g., the PCB 810) through a connection member.

The electronic device (e.g., the electronic device 200) according to an embodiment of the disclosure may include an electronic device (e.g., the electronic device 200) wherein the connecting interface (e.g., the connecting interface 820) and the reinforcement member (e.g., the reinforcement member 830) are disposed below the display (e.g., the display module 840) forming the front surface of the electronic device (e.g., the electronic device 200).

The electronic device (e.g., the electronic device 200) according to an embodiment of the disclosure may include an electronic device (e.g., the electronic device 200) wherein the reinforcement member (e.g., the reinforcement member 830) is placed to surround the side surface of the connecting interface (e.g., the connecting interface 820) while being in direct contact with the side surface of the connecting interface.

The electronic device (e.g., the electronic device 200) according to an embodiment of the disclosure may include an electronic device (e.g., the electronic device 200) wherein the reinforcement member (e.g., the reinforcement member 830) is disposed to surround the side surface of the connecting interface (e.g., the connecting interface 820) while being spaced apart from the side surface of the connecting interface.

The electronic device (e.g., the electronic device 200) according to an embodiment of the disclosure may include an electronic device (e.g., the electronic device 200) wherein the height of the reinforcement member (e.g., the reinforcement member 830) from the PCB (e.g., the PCB 810) is not uniform.

The electronic device (e.g., the electronic device 200) according to an embodiment of the disclosure may include an electronic device (e.g., the electronic device 200) wherein the connecting interface (e.g., the connecting interface 820) is a USB C type interface.

The electronic device (e.g., the electronic device 200) according to an embodiment of the disclosure may include an electronic device (e.g., the electronic device 200) wherein the reinforcement member (e.g., the reinforcement member 830) and the connecting interface (e.g., the connecting interface 820) may be integrated with each other.

The electronic device (e.g., the electronic device 200) according to an embodiment of the disclosure may include an electronic device (e.g., the electronic device 200) wherein the reinforcement member (e.g., the reinforcement member 830) and the connecting interface (e.g., the connecting interface 820) do not form a stacked structure.

The electronic device (e.g., the electronic device 200) according to an embodiment of the disclosure may include an electronic device (e.g., the electronic device 200) wherein the reinforcement member (e.g., the reinforcement member 830) is disposed on the PCB (e.g., the PCB 810) so as not to block the opening through which the connecting interface (e.g., the connecting interface 820) is electrically connected to the external connector (e.g., the external connector 220).

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and detail may be made therein without departing from the spirit and scope of the disclosure as defined by the appended claims and their equivalents.

What is claimed is:

1. An electronic device comprising:
    a display configured to form a front surface of the electronic device;
    a housing in which the display is seated and configured to form at least a first side surface of the electronic device;
    an opening provided in the first side surface formed by the housing;
    a printed circuit board (PCB) disposed adjacent to the first side surface;
    a connecting interface disposed on the PCB and configured to be electrically connected to an external connector when the external connector is inserted through the opening; and
    a reinforcement member disposed on the PCB and configured to surround a side surface of the connecting interface without covering a top surface of the connecting interface,
    wherein the connecting interface, the reinforcement member and the PCB form a structure having at least three sides with an air gap therein.

2. The electronic device of claim 1, wherein a height of the connecting interface is substantially equal to a height of the reinforcement member.

3. The electronic device of claim 1, wherein a height of the reinforcement member is smaller than a height of the connecting interface.

4. The electronic device of claim 1, wherein the display is a liquid crystal display (LCD).

5. The electronic device of claim 1, wherein the reinforcement member is disposed on the PCB based on surface mount technology (SMT).

6. The electronic device of claim 1, wherein the reinforcement member is formed of stainless steel.

7. The electronic device of claim 1, further comprising an air gap formed between the display and the reinforcement member.

8. The electronic device of claim 1, wherein the connecting interface is further configured to be connected to the reinforcement member through a connection member.

9. The electronic device of claim 8, wherein the connection member is disposed between the reinforcement member and the PCB.

10. The electronic device of claim 8, wherein the connection member is disposed on the reinforcement member.

11. The electronic device of claim 8, wherein the connecting member extends from an upper surface of the reinforcement member to an upper surface of the connecting interface.

12. The electronic device of claim 1, wherein the connecting interface is further configured to be connected to the PCB through a connection member.

13. The electronic device of claim 1, wherein the connecting interface and the reinforcement member are disposed below the display forming the front surface of the electronic device.

14. The electronic device of claim 1, wherein the reinforcement member is configured to surround the side surface of the connecting interface while in direct contact with the side surface of the connecting interface.

15. The electronic device of claim 1, wherein the reinforcement member is configured to surround the side surface of the connecting interface while spaced apart from the side surface of the connecting interface.

16. The electronic device of claim 1, wherein a height of the reinforcement member from the PCB is not uniform.

17. The electronic device of claim 1, wherein the connecting interface is a universal serial bus (USB)-C type interface.

18. The electronic device of claim 1, wherein the reinforcement member and the connecting interface are integrated with each other.

19. The electronic device of claim 18, wherein the reinforcement member and the connecting interface are not stacked.

20. The electronic device of claim 1, wherein the reinforcement member is disposed on the PCB so as not to block the opening through which the connecting interface is electrically connected to the external connector.

21. The electronic device of claim 1, wherein the reinforcement member and the PCB directly abut each other along a horizontal plane extending in a direction toward the connecting interface and separate prior to reaching the connecting interface to form the structure having the at least three sides with the air gap therein.

* * * * *